United States Patent
Mukaihira (10) Patent No.: US 7,320,116 B2
(45) Date of Patent: Jan. 15, 2008

(54) METHOD OF GENERATING CELL LIBRARY DATA FOR LARGE SCALE INTEGRATED CIRCUITS

(75) Inventor: Kazunobu Mukaihira, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 400 days.

(21) Appl. No.: 11/167,280

(22) Filed: Jun. 28, 2005

(65) Prior Publication Data

US 2006/0215457 A1 Sep. 28, 2006

(30) Foreign Application Priority Data

Mar. 25, 2005 (JP) ............................. 2005-088040

(51) Int. Cl.
*G06F 17/50* (2006.01)
(52) U.S. Cl. ..................... 716/5; 716/4; 716/9; 716/10; 716/11
(58) Field of Classification Search .................... 716/2, 716/4–5, 8–11; 703/13–15
See application file for complete search history.

(56) References Cited

U.S. PATENT DOCUMENTS

| | | | |
|---|---|---|---|
| 6,219,630 B1* | 4/2001 | Yonezawa et al. ............. 703/14 |
| 6,421,814 B1* | 7/2002 | Ho ................................. 716/5 |
| 7,139,990 B2* | 11/2006 | Singh et al. .................... 716/5 |
| 2003/0088842 A1* | 5/2003 | Cirit ............................... 716/9 |
| 2004/0163068 A1* | 8/2004 | Fukita et al. ................... 716/11 |

FOREIGN PATENT DOCUMENTS

| | | |
|---|---|---|
| JP | 2000-133800 | 5/2000 |
| JP | 2003-256492 | 9/2003 |

* cited by examiner

*Primary Examiner*—Paul Dinh
(74) *Attorney, Agent, or Firm*—Westerman, Hattori, Daniels & Adrian, LLP.

(57) ABSTRACT

A method of generating library data for a cell constructed of interconnected MOS transistors, includes a resistance extraction step which extracts source and drain resistances according to source and drain region surface areas by using a resistance calculating formula or referring to a resistance extraction reference file which, when the source and drain regions have a first surface area region, treats the source and drain resistances as resistance values depending on the surface areas, and when the source and drain regions have a second surface area region larger than the first surface area region, treats the source and drain resistances as fixed resistance values; and a simulation step which generates an input-output characteristic for the cell from a netlist containing a MOS transistor model that includes the extracted source resistances and drain resistances and connection information for the model, and from input signals.

10 Claims, 11 Drawing Sheets

METHOD OF GENERATING CELL LIBRARY DATA FOR LARGE SCALE INTEGRATED CIRCUITS

CROSS-REFERENCE TO RELATED APPLICATIONS

This application is based upon and claims the benefit of priority from the prior Japanese Patent Application No. 2005-88040, filed in Mar. 25, 2005, the entire contents of which are incorporated herein by reference.

BACKGROUND OF THE INVENTION

1. Field of the Invention

The present invention relates to a method of generating cell library data for large scale integrated circuits, and more particularly to a cell library data generating method that can very precisely extract the source-drain resistances of the miniaturized MOS transistors making up the cell and very precisely generate cell input-output characteristics.

2. Description of the Related Art

Application-specific integrated circuits (ASIC) are designed using multiple types of cells that are registered in a library. Each cell is composed of a single MOS transistor or a combination of multiple MOS transistors, and has a specific function (e.g., inverter, NAND, NOR, ENOR, RS-FF). A logic circuit designed using these cells is actually laid out only after it has been confirmed in a logic verification step that the logic of the logic circuit is correctly designed. Next, the delay time characteristics in this laid-out state are calculated, and timing verification is carried out to determine whether the intended operation can be performed based on the actual delay characteristic. The cell data stored in the library thus includes, in addition to layout data, further information such as the input-output characteristic and the delay time.

When a device is newly designed, the cells are designed using MOS transistors which conform to certain design rules. To achieve the logic function of a cell, a plurality of MOS transistors are connected together to make up the cell. Characteristic parameters for the MOS transistors within a cell, such as their gate widths, gate lengths, drain resistances and source resistances, can be determined from the specific construction of the transistors. Moreover, based on these characteristic parameters, information such as the cell input-output characteristic and delay time can be determined.

The drain resistances and source resistances of the MOS transistors making up a cell can generally be determined with RC extraction tools, and the cell input-output characteristic and delay time characteristic can be determined with a simulator tool. That is, device characteristics such as the parasitic resistance and parasitic capacitance of the MOS transistors making up a cell can be extracted using these RC extraction tools, and the cell characteristics such as the input-output characteristic can be determined using the simulator tool. Once it has been determined, the input-output characteristic is registered as cell library data.

Japanese Patent Application Laid-open No. 2000-133800 and Japanese Patent Application Laid-open No. 2003-256492 describe methods for determining the characteristic parameters of MOS transistors. These patent publications describe methods for evaluating MOS transistor characteristics and methods for evaluating contact resistances.

SUMMARY OF THE INVENTION

Over the past few years, MOS devices for integrated circuits have been steadily getting smaller. With the continuing miniaturization of MOS devices, it has become impossible to precisely extract resistance values using conventional methods of extracting source and drain resistances. For example, these prior-art methods rely on the rule that the resistance value of a drain diffusion region is proportional to the distance between the contact and the gate, and is uniformly determined from the layout data for the MOS device. However, we have found that such a rule is not applicable to miniaturized MOS transistors.

It is therefore an object of the present invention to provide a cell library data generating method which can precisely extract source and drain resistance values for miniaturized MOS transistors and generate library data that includes more precise input-output characteristics.

In one aspect, the invention thus provides a method of generating library data for a cell constructed of interconnected MOS transistors having source and drain regions with metal silicided surfaces, which method includes a resistance extraction step which extracts source and drain resistances for the MOS transistors according to source and drain region surface areas by using a resistance calculating formula or referring to a resistance extraction reference file which, when the source and drain regions have surface areas with a first surface area region, treats the source and drain resistances as resistance values which depend on the surface areas, and when the source and drain regions have surface areas with a second surface area region that is larger than the first surface area region, treats the source and drain resistances as fixed resistance values which are independent of the surface areas; and a simulation step which generates an input-output characteristic for the cell from a netlist containing a MOS transistor model that includes the source resistances and drain resistances extracted in the resistance extraction step and connection information for the model, and from input signals.

According to the foregoing first aspect of the invention, when determining the input-output characteristic for a cell constructed of interconnected MOS transistors having source and drain regions with metal silicided surfaces, resistance value characteristics corresponding to the surface areas of the source and drain regions that is particular to miniaturized MOS transistors are used, thereby enabling the accurate extraction of resistance values for miniaturized MOS transistors and making it possible to generate more precise input-output characteristics.

DESCRIPTION OF THE PREFERRED EMBODIMENTS

Embodiments of the invention are described below in conjunction with the attached diagrams. It is to be understood, however, that the technical scope of the invention is not limited by these embodiments, but is limited only by the appended claims and equivalents thereof.

First, in connection with the description of these embodiments, information included within the library data, such as input-output characteristics, is described here for one example of a cell.

Figure 1:
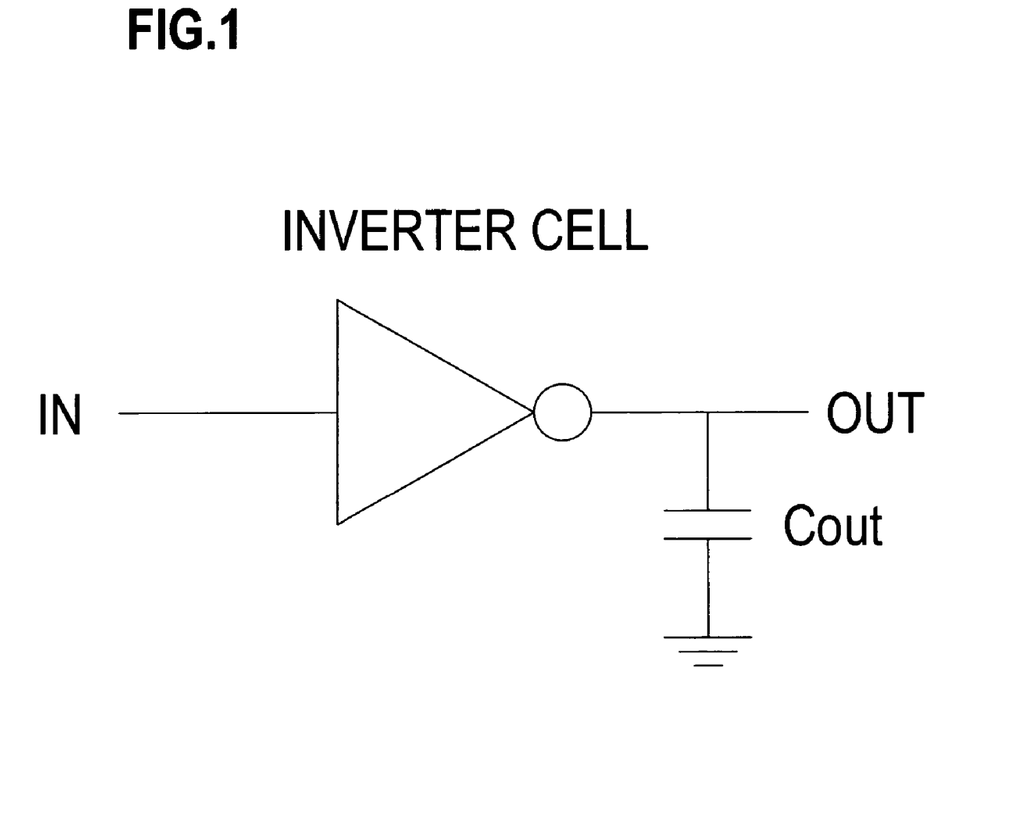
FIG. 1 is a diagram illustrating an example of a cell in an embodiment of the invention.

FIG. 1 is a diagram showing one example of a cell in these embodiments of the invention. This cell is an inverter gate having an input terminal IN and an output terminal OUT. An output load capacitance Cout is connected to the output OUT. The cell has an output signal characteristic for a given input signal, which characteristic is dependent on the ability to drive the transistors making up the inverter gate and the size of the output load capacitance Cout.

Figure 2:
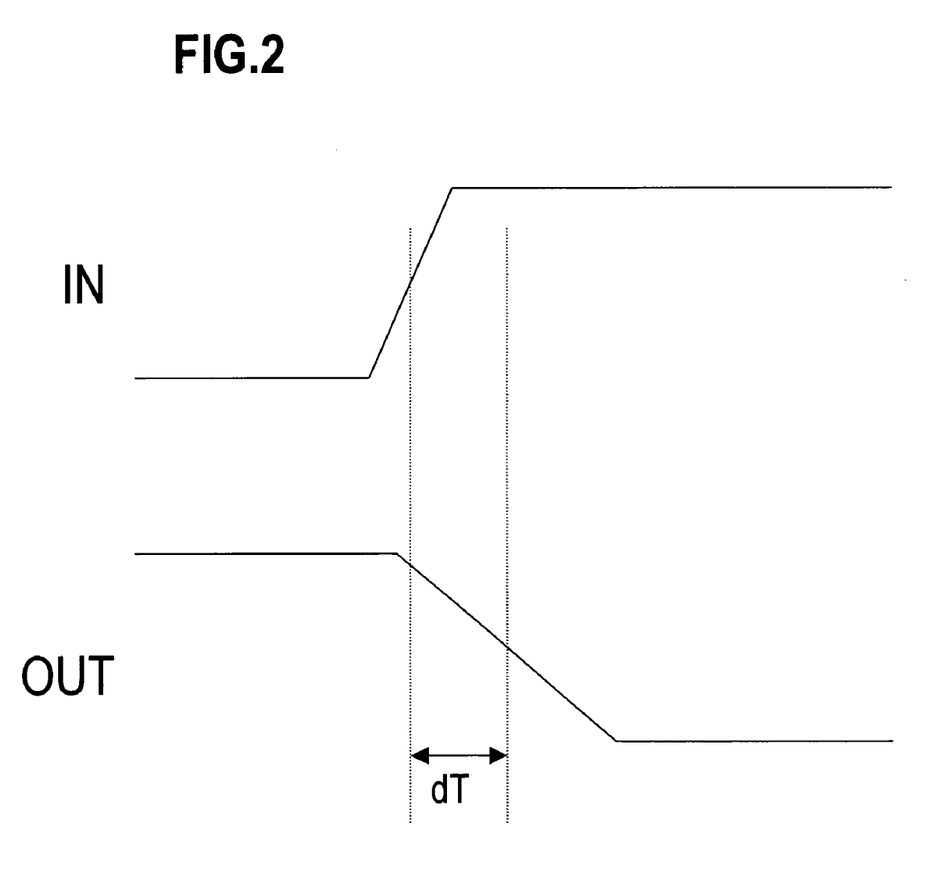
FIG. 2 is a diagram showing an example of the input-output characteristic for the cell in FIG. 1.

FIG. 2 is a diagram showing an example of the input-output characteristic for the cell in FIG. 1. In this example, for an input signal at the input IN that rises from a low level to a high level, at the output OUT generated is an output signal which falls from a high level to a low level. As noted above, the output signal waveform at the output OUT varies according to the ability to drive the MOS transistors making up the inverter gate. In other words, the larger the transistor drivability, the steeper the waveform at the output OUT. The output signal waveform is also dependent on the output load capacitance Cout; the larger the output load capacitance Cout, the more gradual the resulting waveform at the output OUT. Accordingly, the waveform characteristic at the output OUT is dependent on, for example, the output load capacitance Cout. The cell has a delay time dT which is the difference between the rise time at the input IN and the fall time at the output OUT.

Such cell input-output characteristics are stored beforehand as attribute data in a cell library. When a cell-based integrated circuit is designed, this stored input-output characteristic is used to compute information such as the cell delay time required for timing verification.

Figure 3:
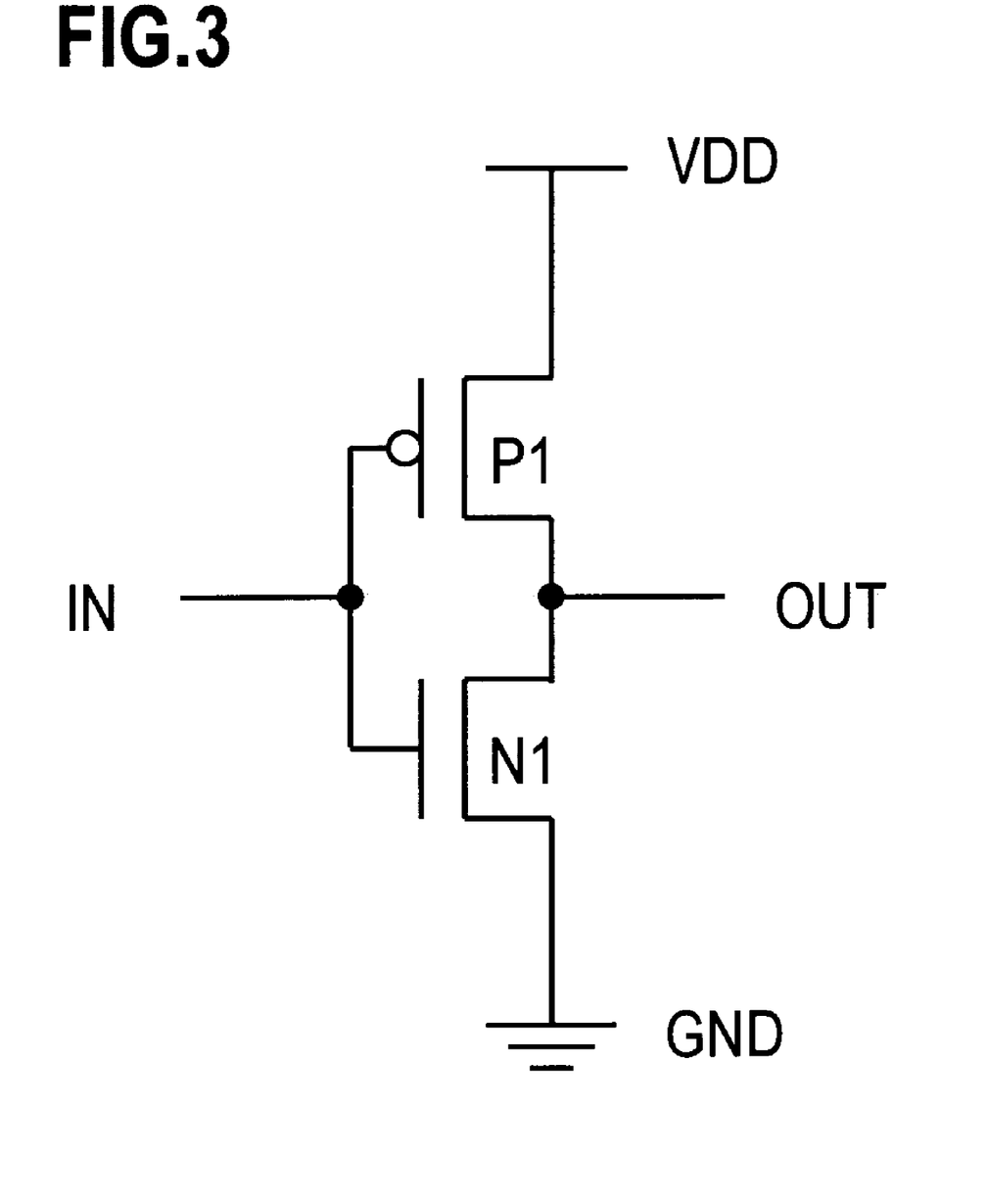
FIG. 3 is a circuit diagram of the cell in FIG. 1.

FIG. 3 is a circuit diagram of the cell in FIG. 1. The inverter gate is composed of a p-channel transistor P1 connected to a power supply VDD side and an n-channel transistor N1 connected to a ground GND side. The connection point between the p-channel transistor and the n-channel transistor N1 serves as the output terminal OUT. Thus, the inverter gate, which is an example of a cell, is designed in a configuration having two connected MOS transistors.

Figure 4:
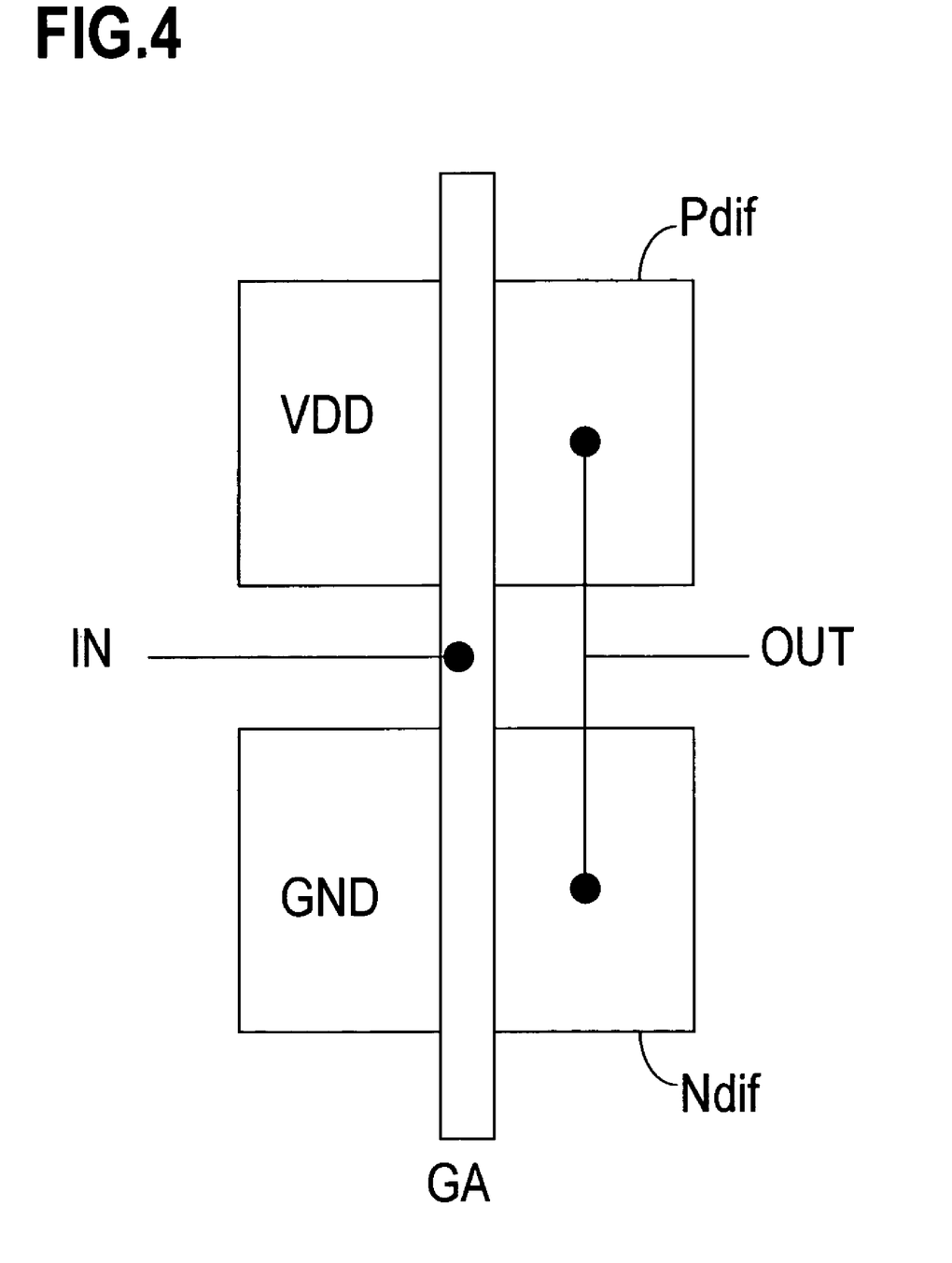
FIG. 4 is a layout diagram of the inverter gate in FIG. 3.

FIG. 4 is a layout diagram of the inverter gate in FIG. 3. In this layout example, a p-diffusion region Pdif and an n-diffusion region Ndif are provided in parallel, and a gate electrode GA is provided for the respective diffusion regions. The power supply VDD and the ground GND are connected to the nodes shown in the diagram, and the output terminal OUT is connected as shown in the diagram. An input terminal IN is connected to the gate GA.

Specific design procedures are followed in designing a cell circuit like that in FIG. 3 and in designing the corresponding cell layout 1 shown in FIG. 4. The cell is composed of a plurality of interconnected MOS transistors, and the MOS transistors have structures specified by such parameters as the source diffusion region, drain diffusion region, source and drain contact structure, gate width and gate length. The characteristic parameters of the MOS transistors, including their source resistance, drain resistance, on resistance (the resistance when the transistor is on), gate width and gate length, must be determined from this structure. Then, based on the characteristic parameters of the MOS transistors in the cell and on a netlist which includes MOS transistor interconnection information, the output-input characteristic shown in FIG. 2 can be determined by simulation.

Figure 5:
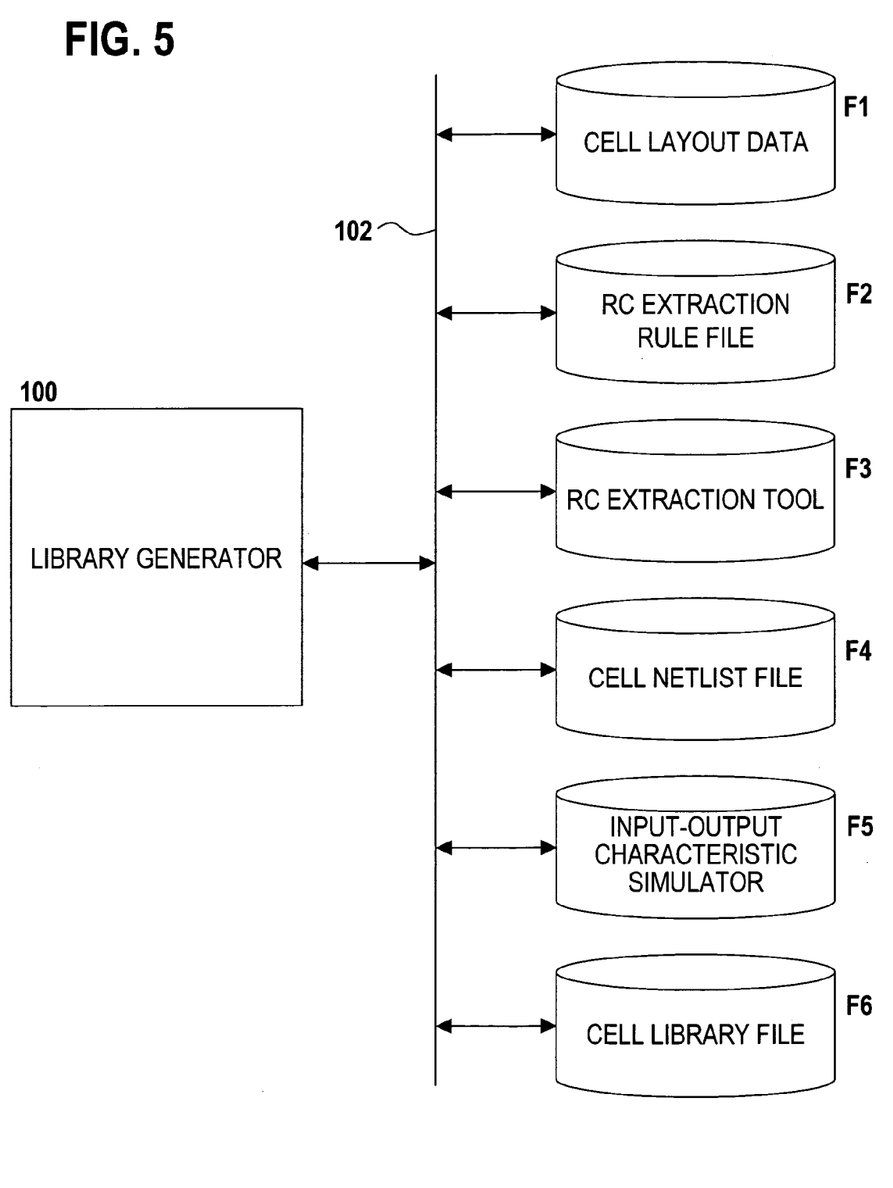
FIG. 5 is a schematic of a library generator which generates cell library data in the same embodiment.

FIG. 5 is a schematic of a library generator for generating cell library data in the present embodiment. A library generator 100 consisting of a general-purpose computer is provided, via a connection bus 102, with a plurality of files F1 to F6 composed of data and programs. The cell layout data F1 is data on, for example, the layout shown in FIG. 4, and includes multiple layers of layout data, such as mask layout data on the silicon substrate, mask layout data on the contact structure, and mask layout data for a multilayer interconnect structure.

The RC extraction rule file F2 is a file containing an extraction rule table of resistance values R and capacitance values C which can be determined based on information included in the layout data, such as the shapes of the source and drain regions and the contact structure. This RC extraction rule file is rule data for determining resistance values and capacitance values from the structure of the MOS transistor, such as a reference table having resistance values and capacitance values corresponding to the structure of the MOS transistor. Specific examples of this RC extraction rule file are described later.

The RC extraction tool F3 is a program which refers to the table in the RC extraction rule file F2 according to the layout data, and extracts information such as the source and drain resistances for a MOS device. Therefore, if the RC extraction rule file F2 has not been correctly set, the source and drain resistances for the MOS device cannot be accurately extracted. The cell netlist file F4 is data indicating the interconnection configuration of a cell made up of circuit elements such as MOS devices. The netlist includes, as attribute data for the MOS transistors making up the cell, characteristic parameters of the MOS transistors such as their source and drain resistances extracted by the RC extraction tool F3.

The input-output characteristic simulator F5 is a simulation program which, when provided with the cell netlist and input signals, uses such information to simulate, for example, the cell input-output characteristic. Cell input-output characteristic can be obtained by this input-output characteristic simulator F5. The cell library file F6 is a file of cell attribute data which, in addition to the cell layout data, contains input-output characteristic data. The input-output characteristic data contained in this cell library is used for such purposes as to calculate the cell delay time in a timing verification step for the logical design of an ASIC using the cell.

Figure 6:
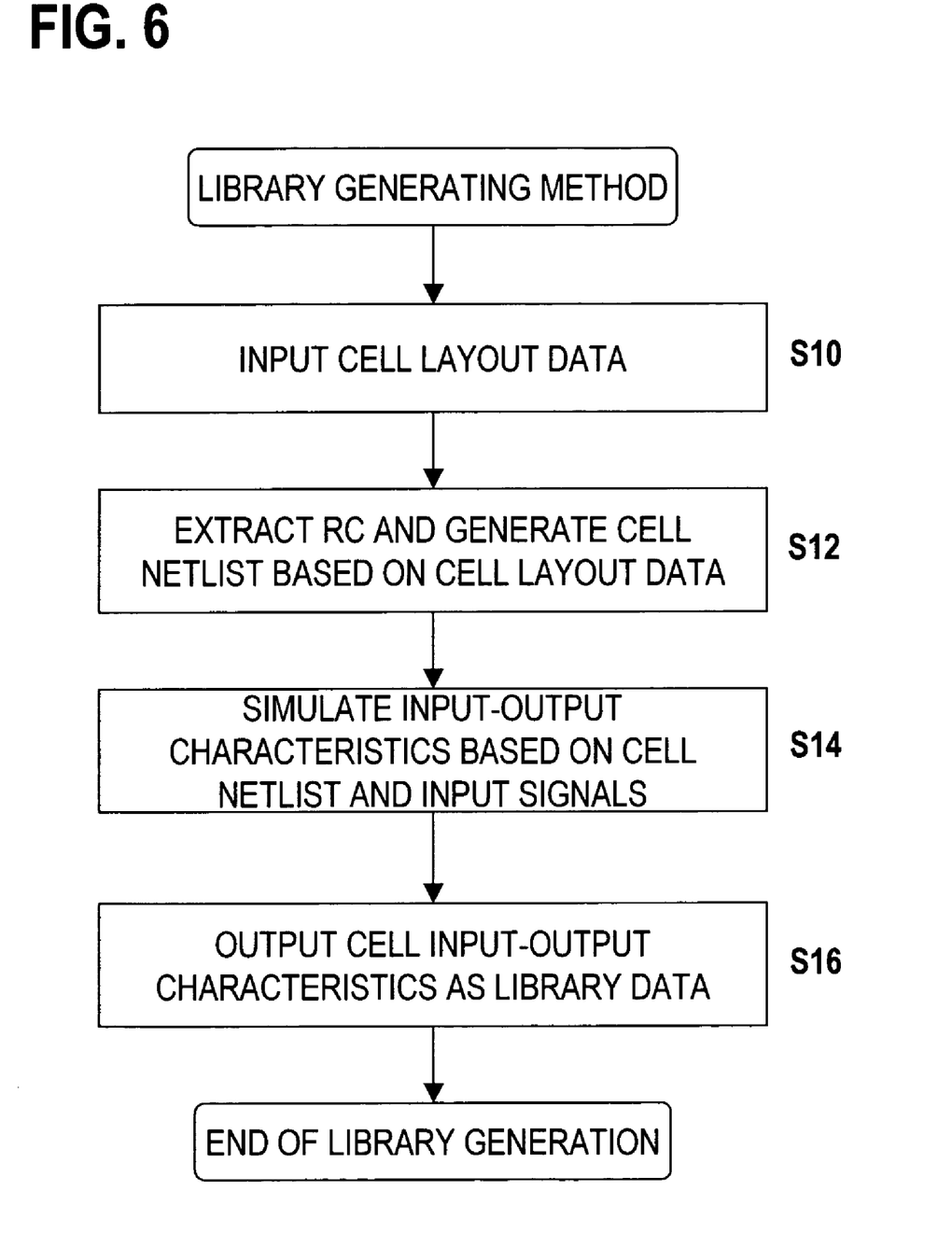
FIG. 6 is a flow chart of the cell library generating method in the same embodiment.

FIG. 6 is a flow chart for the cell library generating method of the present embodiment. The layout data for a newly designed cell composed of interconnected MOS transistors is input (S10). The cell layout data includes layout data for a plurality of MOS transistors and interconnection data for the transistors. Next, by means of layer calculation on the cell layout data that has been input, the RC extraction tool F3 extracts surface areas for diffusion layers in the source and drain regions, then extracts source and drain resistances corresponding to these extracted diffusion layer surface areas (S12). In the extraction of source and drain resistances, resistance values corresponding to the diffusion layer surfaces areas are generated or extracted by using the subsequently described formula for calculating diffusion layer surface areas, or referring to the subsequently described resistance value table, in the RC extraction rule file F2. Next, a netlist containing the MOS transistors for which these extracted source and drain resistances serve as the attribute data and containing also interconnection data for the transistors is generated (S12).

The MOS transistors M1 and M2 making up the netlist may be represented as follows.

|    |   |   |   |   |      |
|----|---|---|---|---|------|
| M1 | D | G | S | B | nmos |
| M2 | D | G | S | B | pmos |

The transistor models nmos and pmos include, as attribute data, the gate length L (μm), the gate width W (μm), the drain resistance NRD (sheet number) and the source resistance NRS (sheet number). Here, "sheet number" refers to the resistance value divided by the sheet resistivity (resistance of a unit surface area). When the source and drain resistances are indicated as sheet numbers, the actual resistance values can be obtained by multiplying these numbers by the sheet resistivity particular for that device.

Therefore, by adding the above-indicated MOS transistor connection data to the extracted source and drain resistances, the cell netlist is completed. The netlist interconnection information is the same as in the prior art and so specific examples are omitted here.

In addition to extracting the above-described source and drain resistances, the RC extraction tool F3 also extracts information such as wiring capacitances and source and drain capacitances based on specific rule files.

Next, the input-output characteristic simulator F5 simulates an input-output characteristic based on the generated netlist and on input signals (S14). This simulator F5 is a circuit simulation tool such as the commonly known SPICE which simulates the operation of the cell based on the netlist and input signals, and determines an input-output characteristic like that shown in FIG. 2. The resulting cell input-output characteristic is output as library data (S16).

R Extraction Rule File:

Next, the R extraction rule file in this embodiment is described. Innovations in technology have been accompanied by a downward trend in the on resistance of MOS transistors. Conversely, the resistance of the diffusion layers in the source and drain regions, which is one type of parasitic resistance in MOS transistors, has tended to grow larger on account of the decrease in the thickness of the silicide layer at the surface of the diffusion layer associated with miniaturization. The degree to which the source and drain resistances participate in the circuit operation of cells has thus gotten larger, making it important to accurately estimate these resistance values.

Prior-art source and drain diffusion layer resistances are extracted in proportion to the distance between the positions of the source and drain contacts and the gate electrode, regardless of the cross-sectional structure of the MOS transistor. That is, the current flows primarily within the source and drain diffusion layers from the source and drain contact positions to the gate electrode. Moreover, in cases where the surfaces of the source and drain diffusion regions have been metal silicided with cobalt or the like, the current flows within this metal silicide layer. Accordingly, the source and drain resistances have been regarded as being proportional to the above distances.

To reduce the parasitic resistances at the source and drain associated with the miniaturization of MOS transistors, it is now becoming common to metal silicidize the surface of the source and drain diffusion regions. In such a metal silicided structure, the path over which current flows within the source and drain regions differs from the current path in a diffusion region by itself.

Figure 7:
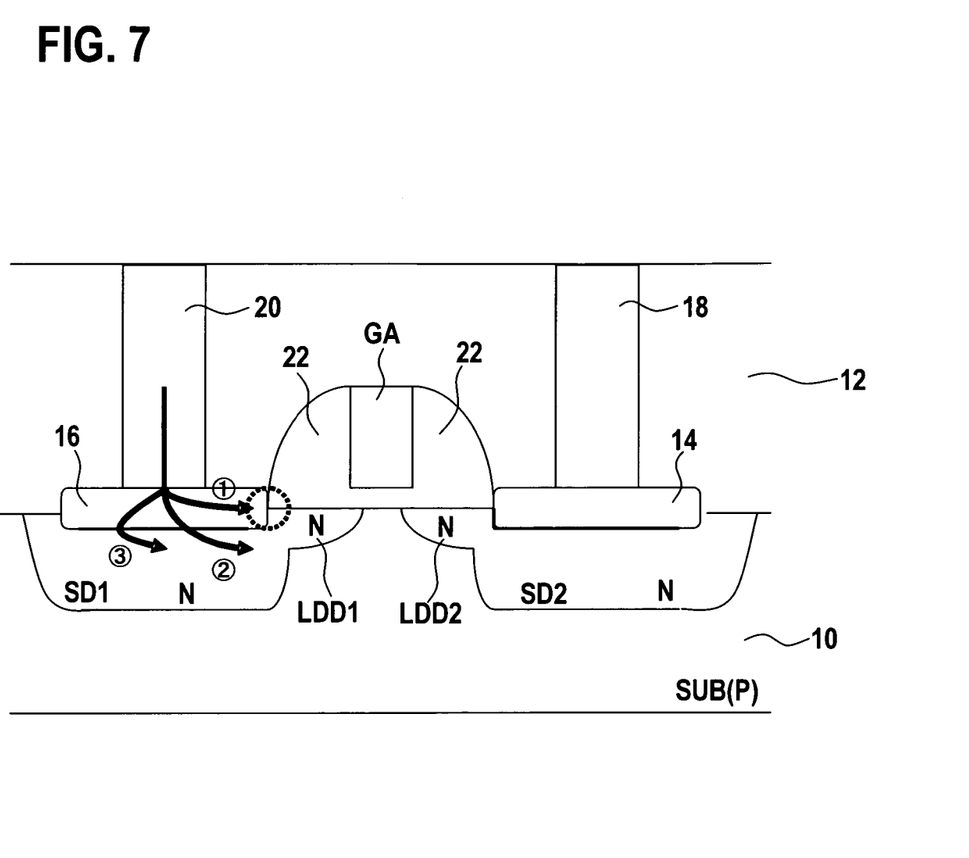
FIG. 7 is a cross-sectional view of a MOS device.

FIG. 7 is a cross-sectional view of a MOS device. In the cross-sectional structure of this MOS transistor, n-type source and drain diffusion regions SD1 and SD2 are formed in the surface region of a p-type silicon substrate SUB, and cobalt silicide layers 14 and 16 are formed at the surface of type source and drain diffusion regions SD1 and SD2. Silicide layers 14 and 16 are formed over substantially the entire surface of the source and drain diffusion regions SD1 and SD2, and have substantially the same surface areas as the source and drain diffusion regions. N-type light-doped diffusion (LDD) regions LDD1 and LDD2 (extension regions) are formed on the gate electrode GA sides of source and drain diffusion regions SD1 and SD2. Sidewalls 22 of silicon oxide are formed on both sides of the gate electrode GA. Vias 18 and 20 made of contact metal are formed in an interlayer dielectric film 12 in such a way as to connect to the silicide layers 14 and 16.

In this system, the contact resistance at the interface between the silicide layer (metal) and the diffusion region (semiconductor), and the area in the LDD region where the width of the current path at the LDD region narrows, account for a large proportion of the overall source and drain resistance. For this reason, the current flow from the via 20 to the gate GA shown in FIG. 7, rather than following through a lateral current path 1 along the silicide layer 16, predominantly follows through current paths 2 and 3 which head from the silicide layer 16 toward the source-drain region SD1, then along source-drain diffusion region SD1. In other words, current path 1 having a large resistance value is not dominant; instead, current paths 2 and 3, which extend over the entire region of silicide layer 16 as seen from above, dominate.

On current path 1, the resistance value varies in proportion to the distance between the contact position where via 20 is formed and the gate electrode GA. However, in miniaturized MOS transistors, it is necessary to determine the resistance values owing to the dominant current path 2 and 3 while taking into consideration not only the surface layout structure, but also the three-dimensional structure within the silicon substrate. Consequently, as explained below, the source and drain resistances of the miniaturized MOS transistor are dependent on the surface area of the silicide layer 16, 14; that is, the surface areas of source-drain regions SD1 and SD2.

Figure 8:
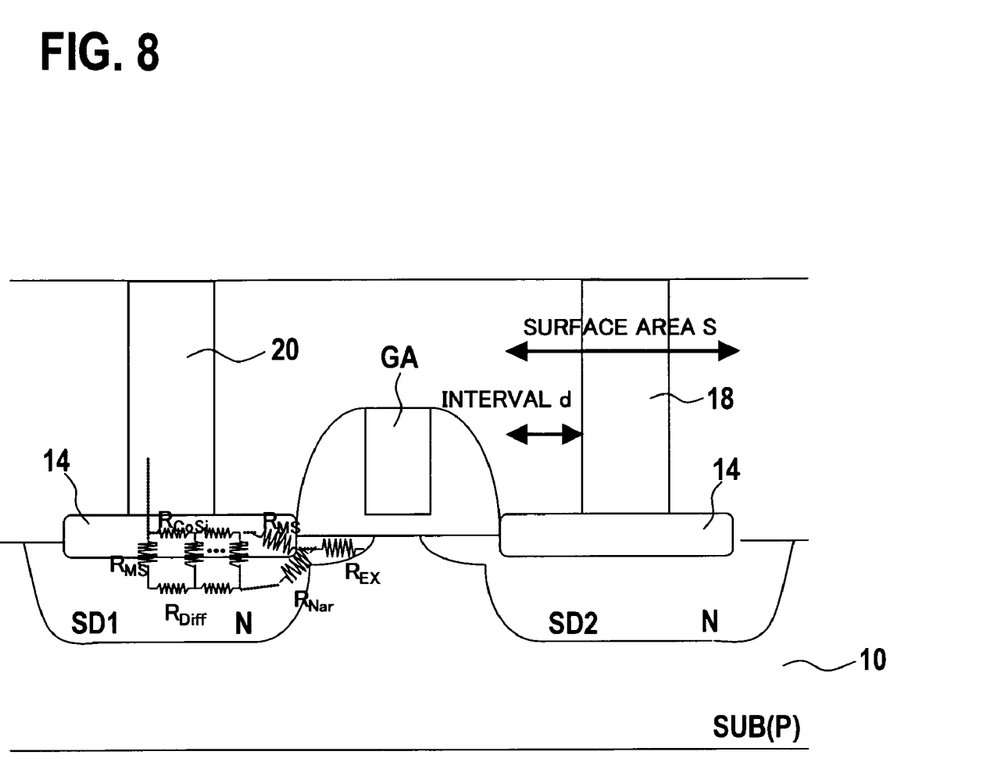
FIG. 8 shows the resistance circuits in a source-drain region SD1 in a cross-sectional view of a MOS device.

FIG. 8 shows the resistance circuits in a source-drain region SD1 in a cross-sectional view of a MOS device. This resistance circuit consists of a lateral resistance component Rcosi for a cobalt silicide layer 14, an interfacial resistance RMS between the silicide layer 14 and the silicon semiconductor, a lateral resistance RDIFF for the source-drain diffusion region SD1, a resistance RNar for a narrow-width region near extension region LDD1 in diffusion region SD1, and a resistance REX for extension region LDD1. The narrow-width region resistance RNar is a high resistance value because this region has a small width. In recent miniaturized MOS transistors, there has been a tendency for the film thickness of the silicide layer 14 to become small and for its resistance Rcosi in the lateral direction to become large. Compared with other resistances, the effect of the interfacial resistance RMS is large, and so the source-drain resistances of miniaturized MOS transistors have resistance values which are dependent on current paths 2 and 3 rather than current path 1.

Figure 9:
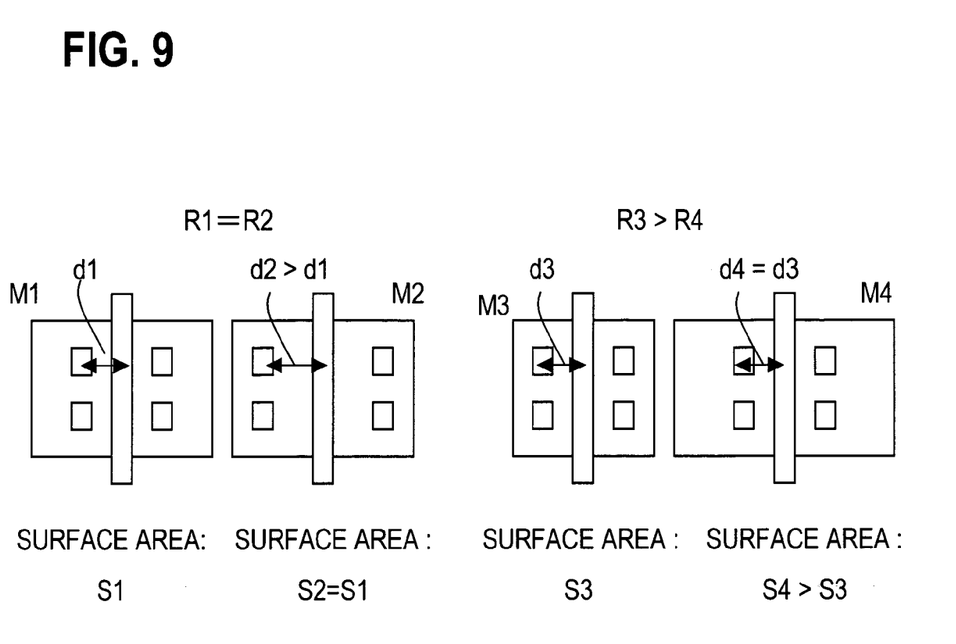
FIG. 9 is a view illustrating the relationship between the layout patterns of miniaturized MOS transistors and their source-drain resistances.

FIG. 9 is a view illustrating the relationship between the layout patterns of miniaturized MOS transistors and their source-drain resistances. The diagram shows the layout patterns for four transistors M1 to M4. In MOS transistors M1 and M2, the distances d1 and d2 between the contacts and the gate electrodes have the relationship d2>d1, but the surface areas S1 and S2 of the source-drain regions are equal (S1=S2). According to the conventional wisdom, if d2>d1, the source-drain resistance R2 of transistor M2 will be larger than the resistance R1 of transistor M1. In fact, however, the current paths 2 and 3 which flow on the silicon substrate side rather than in the silicide layer predominate, and so when the surface areas of the source-drain regions are equal (S1=S2), their source-drain resistances R1 and R2 will also be equal (R1=R2).

On the other hand, when MOS transistors M3 and M4 are compared, although the distances d3 and d4 between the contacts and the gate electrodes are the same, because the surface areas of the source-drain regions differ (S4>S3), the transistor M3 having the smaller surface area has a larger resistance (R3>R4). That is, when the surface areas of the source-drain regions become larger, the current paths 2 and 3 in FIG. 7 apparently increase in number and the source and drain resistance values which are determined thereby decline. Moreover, we have confirmed that as the surface areas increase, the source and drain resistance values cease to depend on the surface areas and become fixed. This is explained more fully below.

Figure 10:
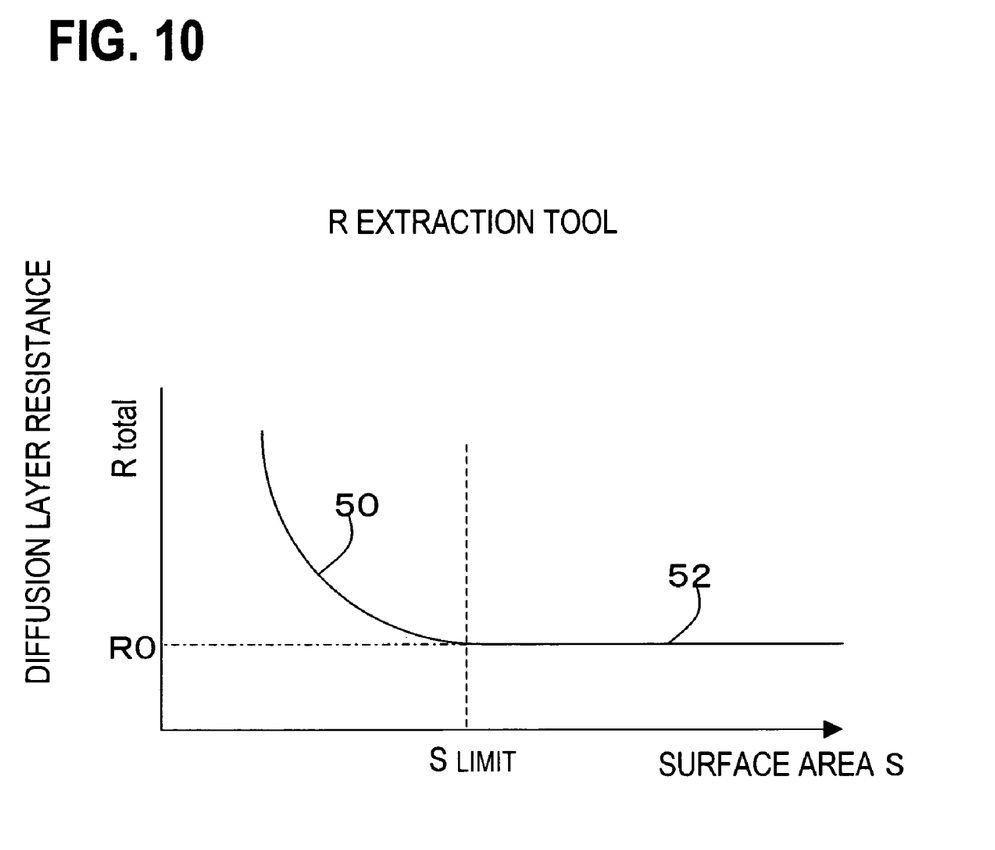
FIG. 10 is a graph showing the relationship between the total resistance value Rtotal of the source-drain resistance and the surface area S of the source-drain region.

FIG. 10 is a graph showing the relationship between the total resistance value Rtotal of the source-drain resistance and the surface area S of the source-drain region. The total resistance value Rtotal of the source-drain region is the synthesized resistance of the resistance circuit in FIG. 8. However, as noted above, the current paths 2 and 3 in FIG. 7 are dominant. Accordingly, the resistance values along current paths 2 and 3 depend on the interfacial resistance RMS between the silicide layer and the semiconductor, the resistance Rdiff within the source-drain diffusion layer, and the narrow region resistance RNar. As a result, the total resistance value Rtotal is divided as follows into two regions according to the surface areas S of the source-drain diffusion layers. These two regions (1) and (2) are described below.

(1) Characteristic 50 of Small Surface Area Region of Source-Drain Diffusion Layer:

In the small surface area region of the diffusion layer, because the interfacial resistance RMS between the silicide layer and the semiconductor is larger than the other resistances, the total resistance Rtotal is determined mainly by this interfacial resistance RMS. That is, in case of the small surface area region, of the three resistances RMS, Rdiff and RNar, the interfacial resistance RMS is the largest. Therefore, the total resistance value Rtotal decreases in inverse proportion with the surface area S of the source-drain region—in the manner of characteristic 50 in FIG. 10.

(2) Characteristic 52 of Large Surface Area Region of Source-Drain Diffusion Layer:

In the large surface area region of the diffusion layer, the interfacial resistance RMS is sufficiently small and the narrow region resistance RNar becomes larger than the other resistances. Hence, this latter resistance RNar determines the total resistance value. In addition, because this resistance RNar does not depend on the surface area S of the source-drain diffusion layer, the total resistance value Rtotal is not dependent on the surface area S and becomes a fixed value R0.

As explained above, the source-drain resistance Rtotal has a characteristic represented by the following formula.

$$Rtotal=R0+R(S)$$

$$R(S)=C\times 1/S+C\times 2(S<SLIMIT)$$

$$R(S)=0(S>SLIMIT)$$

Here, R0 is a fixed value, S is the surface area of the source-drain diffusion layer (surface area of source-drain region), SLIMIT is the surface area of the interface between the two regions, and C×1 and C×2 are each constants.

Therefore, by measuring the source-drain resistance of an actual sample of the newly designed MOS transistor and inserting the measured value into the above formula, and determining the constants R0, C×1, C×2 and SLIMIT, an R extraction table F2 (FIG. 5) for this MOS transistor can be generated. Moreover, when cell library data is to be generated, by directly applying the above formula for calculating R or referring to this R extraction table, the source-drain resistances of the MOS transistors within the cell can be very precisely extracted on the basis of the cell layout data.

Figure 11:
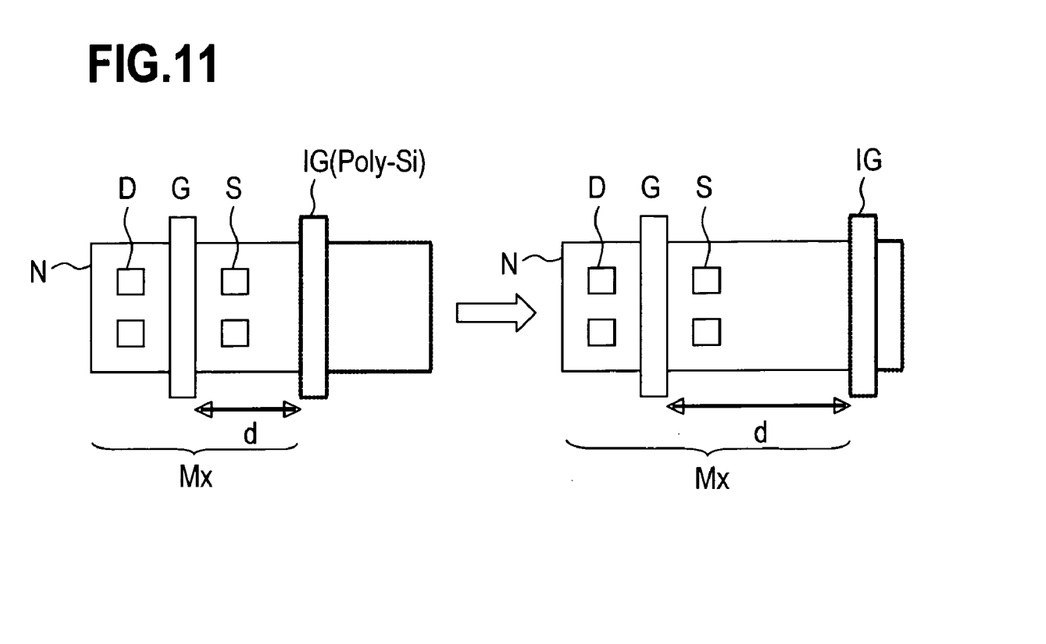
FIG. 11 is a diagram showing an example of a model for evaluating the source-drain resistance of a MOS transistor.
Figure 12:
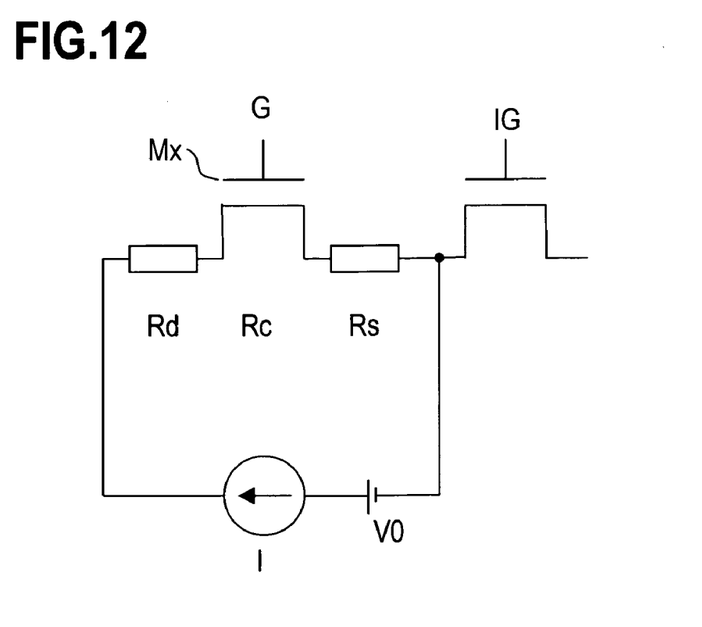
FIG. 12 is a diagram showing an example of a measurement model being used to measure source-drain resistances for the transistor model in FIG. 11.

FIG. 11 is a diagram showing an example of a model for evaluating the source-drain resistance of a MOS transistor. FIG. 12 is a diagram showing an example of a measurement model being used to measure source-drain resistances for the transistor model in FIG. 11. In the evaluation model in FIG. 11, an n-type diffusion layer N is formed by a surrounding shallow trench isolation (STI) structure, in addition to which a gate electrode G, a drain contact D and a source contact S are formed. Moreover, in this evaluation model, an isolation gate IG made of the same polysilicon as the gate electrode G is positioned at a distance d from the gate electrode G. With this evaluation model, a plurality of transistors Mx of varying distances d on a silicon substrate are formed. In a circuit configuration like that in FIG. 12, the current I when a voltage V0 is applied across the source and drain of the transistor model Mx is measured, and the source resistance Rs is determined. Here, it is assumed that the drain resistance Rd and the ON resistance Rc for the transistor are already known.

If a plurality of transistor models Mx are each given different source region surface areas and the source resistances Rs detected in each case are plotted, the R extraction rule graph in FIG. 10 can be obtained. That is, the relationship of the total resistance value Rtotal on the ordinate to the surface area S on the abscissa can be obtained like FIG. 10. Moreover, constants for the above source-drain resistance Rtotal formula can be obtained. The R extraction rule determined in this way is, as noted above, prepared as a table to be referenced by the RC extraction tool, and stored in a memory that can be accessed by a computer, as illustrated by the RC extraction rule file F2 in FIG. 5.

RC extraction step S12 shown in FIG. 6 is explained in connection with the examples in FIG. 7 to FIG. 12. When a semiconductor device is newly designed, the relationship of the source-drain resistance Rtotal to the surface area S of the source region or drain region of the MOS transistor can be determined based on the transistor model shown in FIGS. 11 and 12. This relationship can be determined by actually measuring the transistor models. However, because the MOS transistor size is very small, a source-drain resistance characteristic is found like that shown in FIG. 10. This is a novel characteristic that has not been used in prior-art RC extraction rule files.

Next, as shown in FIG. 5, the characteristic determined as described above is stored as an R extraction rule file F2 in a computer-accessible memory region. Next, in the RC extraction step S12, when cell layout data is input, the RC extraction tool F3 analyzes the multiple layers of layout data and determines by arithmetic operations the surface areas S of the source regions and drain regions of the MOS transistors in the cell. Next, the RC extraction tool F3 extracts the source and drain resistances for the resulting surface areas S by referring to the R extraction rule file F2. The extracted source and drain resistances are generally output in sheet number (numbers obtained by dividing the resistance value by the sheet resistance) units.

In cases where the R extraction rule file F2 contains a table of total resistances Rtotal corresponding to surface areas S, the appropriate resistances Rtotal can be extracted based on the surface areas S obtained from the layout data. In cases where the R extraction rule file F2 contains the constants for the above formula, the extraction tool can insert these constants in the above formula to calculate the resistances Rtotal corresponding to the surface areas S. The R extraction rule file F2 may be in either of these forms.

In this way, the source resistances and drain resistances of MOS transistors in a cell are generated by means of RC extraction tools as attribute data for the transistors, along with parameters such as gate length and gate width. These attribute data are included in a netlist that indicates the interconnection relationships of the MOS transistors, and are supplied, together with information such as input signals, to an input-output characteristic simulator F5. As explained above, the input-output characteristic simulator F5 analyzes the netlist and generates a cell input-output characteristic like that in FIG. 2. This cell input-output characteristic is stored, together with cell layout data, as cell library data.

As shown above, the source and drain resistances of very small MOS transistors having metal silicide layers in the source-drain regions can be more accurately extracted using the foregoing embodiments of the invention. More accurate cell library data can thus be generated.

What is claimed is:

1. A method of generating library data for a cell constructed of interconnected MOS transistors having source and drain regions with metal silicided surfaces, the method comprising:
    a resistance extraction step which extracts source and drain resistances for the MOS transistors according to source and drain region surface areas by using a resistance calculating formula or referring to a resistance extraction reference file which, when the source and drain regions have surface areas with a first surface area region, treats the source and drain resistances as resistance values which depend on said surface areas, and when the source and drain regions have surface areas with a second surface area region that is larger than the first surface area region, treats the source and drain resistances as fixed resistance values which are independent of said surface areas; and
    a simulation step which generates an input-output characteristic for the cell from a netlist containing a MOS transistor model that includes the source and drain resistances extracted in the resistance extraction step and connection information for the model, and from input signals.

2. The library data generating method according to claim 1 wherein the resistance extraction reference file, in the first surface area region, treats the source and drain resistances as resistance values which are inversely proportional to the surface area.

3. The library data generating method according to claim 1, wherein the MOS transistors have source and drain diffusion regions which are formed in a silicon semiconductor substrate, source and drain extension regions which are formed shallower than the source and drain diffusion regions and extend from the source and drain diffusion regions to a gate electrode, a metal silicide layer formed on a surface of the source and drain diffusion regions, and a contact via which is connected to said metal silicide layer.

4. The library data generating method according to claim 1, wherein the resistance extraction step determines the surface areas of the source and drain regions based on layout data for the cell and extracts source and drain resistances based on the determined surface areas.

5. A method of extracting MOS transistor resistances for a cell constructed of interconnected MOS transistors having source and drain regions with metal silicided surfaces, the method being comprised of extracting source and drain resistances for the MOS transistors according to source and drain region surface areas by using a resistance calculating formula or referring to a resistance extraction reference file which, when the source and drain regions have surface areas with a first surface area region, treats the source and drain resistances as resistance values which depend on said surface areas, and when the source and drain regions have surface areas with a second surface area region that is larger than the first surface area region, treats the source and drain resistances as fixed resistance values which are independent of said surface areas.

6. The MOS transistor resistance extracting method according to claim 5, wherein the resistance extraction reference file, in the first surface area region, treats the source and drain resistances as resistance values which are inversely proportional to the surface area.

7. A library data generating program which causes a computer to execute library data generating procedures for a cell constructed of interconnected MOS transistors having source and drain regions with metal silicided surfaces, wherein the procedures include:
    a resistance extraction procedure which extracts source and drain resistances for the MOS transistors according to source and drain region surface areas by using a resistance calculating formula or referring to a resistance extraction reference file which, when the source and drain regions have surface areas with a first surface area region, treats the source and drain resistances as resistance values which depend on said surface area, and when the source and drain regions have surface areas with a second surface area region that is larger than the first surface area region, treats the source and drain resistances as fixed resistance values which are in dependent of said surface areas; and a simulation procedure which generates an input-output characteristic for the cell from a netlist containing a MOS transistor model that includes the source and drain resistances extracted in the resistance extraction procedure and connection information for the model, and from input signals.

8. The library data generating program according to claim 7 wherein the resistance extraction reference file, in the first surface area region, treats the source and drain resistances as resistance values which are inversely proportional to the surface area.

9. A MOS transistor resistance extracting program which causes a computer to execute MOS transistor resistance extracting procedures for a cell constructed of interconnected MOS transistors having source and drain regions with metal silicided surfaces, the program being comprised of the resistance extracting procedures of extracting source and drain resistances for the MOS transistors according to source and drain region surface areas by using a resistance calculating formula or referring to a resistance extraction reference file which, when the source and drain regions have surface areas with a first surface area region, treats the source and drain resistances as resistance values which depend on said surface areas, and when the source and drain regions have surface areas with a second surface area region that is larger than the first surface area region, treats the source and drain resistances as fixed resistance values which are independent of said surface areas.

10. The MOS transistor resistance extracting program according to claim 9, wherein the resistance extraction reference file, in the first surface area region, treats the source and drain resistances as resistance values which are inversely proportional to the surface area.

* * * * *